United States Patent [19]
Chamuel

[11] Patent Number: 4,763,335
[45] Date of Patent: Aug. 9, 1988

[54] LASER DIODE ACOUSTIC NOISE REDUCTION

[75] Inventor: Jacques R. Chamuel, Framingham, Mass.

[73] Assignee: The Charles Stark Draper Laboratory, Inc., Cambridge, Mass.

[21] Appl. No.: 129,376

[22] Filed: Nov. 24, 1987

Related U.S. Application Data

[63] Continuation of Ser. No. 837,872, Mar. 4, 1986, abandoned, which is a continuation of Ser. No. 488,784, Apr. 26, 1983, abandoned.

[51] Int. Cl.⁴ .............................................. H01S 3/096
[52] U.S. Cl. ...................................... 372/33; 357/17; 357/81; 372/36; 372/44
[58] Field of Search ............................ 372/36, 43–46, 372/33; 357/17, 81

[56] References Cited

U.S. PATENT DOCUMENTS

| | | | |
|---|---|---|---|
| 4,092,614 | 5/1978 | Sakuma et al. | 372/36 |
| 4,295,152 | 10/1981 | Khoe et al. | 357/17 |
| 4,423,435 | 12/1983 | Test | 357/80 |

OTHER PUBLICATIONS

Hodgman, *Handbook of Chemistry and Physics*, published 1961, pp. 2682–2697.
Purcell, *Electricity and Magnetism*, Copyright 1965, pp. 184–224.

*Primary Examiner*—James W. Davie
*Attorney, Agent, or Firm*—Weingarten, Schurgin, Gagnebin & Hayes

[57] ABSTRACT

A laser diode assembly and associated heat sink and excitation leads constructed to avoid the electromagnetic or magnetostrictive generation of stress or elastic wave disturbances in the diode, heat sink or associated components so as to maintain spectral purity in the diode laser emission. An improved laser diode assembly avoids the generation of elastic waves or vibrations within the leads, heat sink or associated structure of a laser diode by running excitation leads in a magnetic field cancellation arrangement to prevent magnetostrictively induced elastic waves in structure connected to the laser diode and to avoid vibration induced by coupling between the lead currents and external magnetic fields. The heat sink, electrical input and return leads and associated structure may be fabricated of a nonmagnetostrictive material to avoid magnetostrictively induced acoustic disturbances created by other magnetic field sources in the use environment of the laser diodes.

4 Claims, 2 Drawing Sheets

LASER DIODE ACOUSTIC NOISE REDUCTION

This application is a continuation of application Ser. No. 837,832, filed Mar. 4, 1986, now abandoned, which is a continuation of Ser. No. 488,784, filed 4/26/83, now abandoned.

FIELD OF THE INVENTION

The present invention relates to laser diode assemblies and techniques for maintaining spectral purity in the diode's laser emissions.

BACKGROUND OF THE INVENTION

It is desirable in both military and commercial applications and particularly in fiber optic systems incorporating pulsed semiconductor laser diodes, that the lasing elements emit a stable frequency spectrum. It is well known that the use of semiconductor laser diodes has been limited due to the characteristic impurity of the lasing spectra of known laser diode products. The causes of the spectral impurities have remained unknown.

It is taught in a related disclosure, U.S. Pat. No. 4,688,076, issued in the name of the present inventor to the same assignee of record, that the presence and reverberations of thermoelastic waves in semiconductor diode lasers cause undesirable spectral modulation of the emitted light spectra. The pending application discloses a laser diode heat sink which avoids disturbance of the laser diode output by shaping, contouring and texturing of the heat sink material and geometry to avoid focussing of elastic waves back upon the laser diode. It is also taught in the pending application that the heat sink may be coated with a viscoelastic material to attenuate elastic waves impinging on the surface of the heat sink.

SUMMARY OF THE INVENTION

In accordance with the teaching of the present invention a laser diode assembly is described which exhibits improved spectral emission characteristics when compared to prior laser diode assemblies by avoiding the generation of acoustic waves from magnetostrictive or electromagnetic interacting with magnetic fields.

It has been discovered by this Applicant that the flow of high pulse, pulsating or noisy currents through input and return leads within laser diode assemblies produces a varying magnetic field which magnetostrictively generates acoustic disturbances in a laser diode heat sink and associated structure. The varying magnetic field causes expansion and contraction of the heat sink material and produces elastic or stress waves within the heat sink material which are coupled to the laser diode element. The elastic or stress waves cause the laser diode crystal to deform thereby varying the optical path length of the diode and causing spectral impurities in the light emission. Magnetostrictively caused elastic or stress waves resulting from the flow or varying current through the input and return leads for the laser diode are avoided by configuring the laser excitation leads along a path so as to produce opposing and cancelling magnetic fields of equivalent amplitude. The generation of elastic or stress waves by magnetic field interaction with a magnetostrictive heat sink is thus avoided.

For this purpose laser excitation current leads are kept close and parallel, and may employ a twisted pair or coaxial geometry. Instead of returning current through the heat sink, as in prior art designs, the diode body is electrically insulated from the laser diode circuits and current is returned directly parallel along the routing of the input lead. This provides large magnetic field cancellation during the excitation of the laser diode. It also prevents lead vibration from being induced by external magnetic fields, particularly at low frequencies.

The invention further contemplates fabrication of input and return leads and the heat sink and associated structure of a nonmagnetostrictive material to avoid magnetostrictively induced elastic or stess waves either locally produced by current flow through the input and return leads or resulting from externally produced magnetic fields.

BRIEF DESCRIPTION OF THE DRAWINGS

These and other features of the invention are more fully set forth in the solely exemplary, detailed description and acompanying drawings of which.

DETAILED DESCRIPTION OF THE INVENTION

Figure 1A:
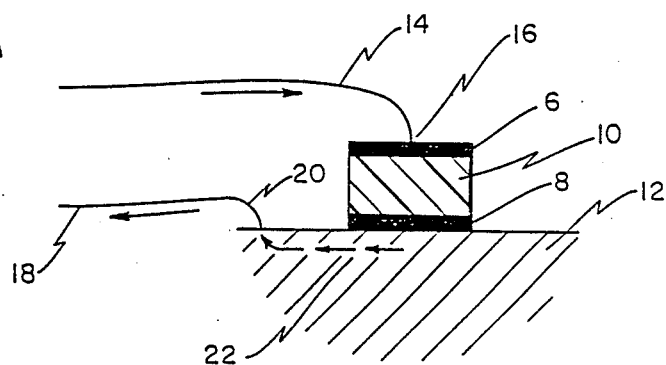
FIGS. 1A and 1B are respectively cross sectional and perspective views illustrating a typical prior art laser diode assembly.
Figure 1B:
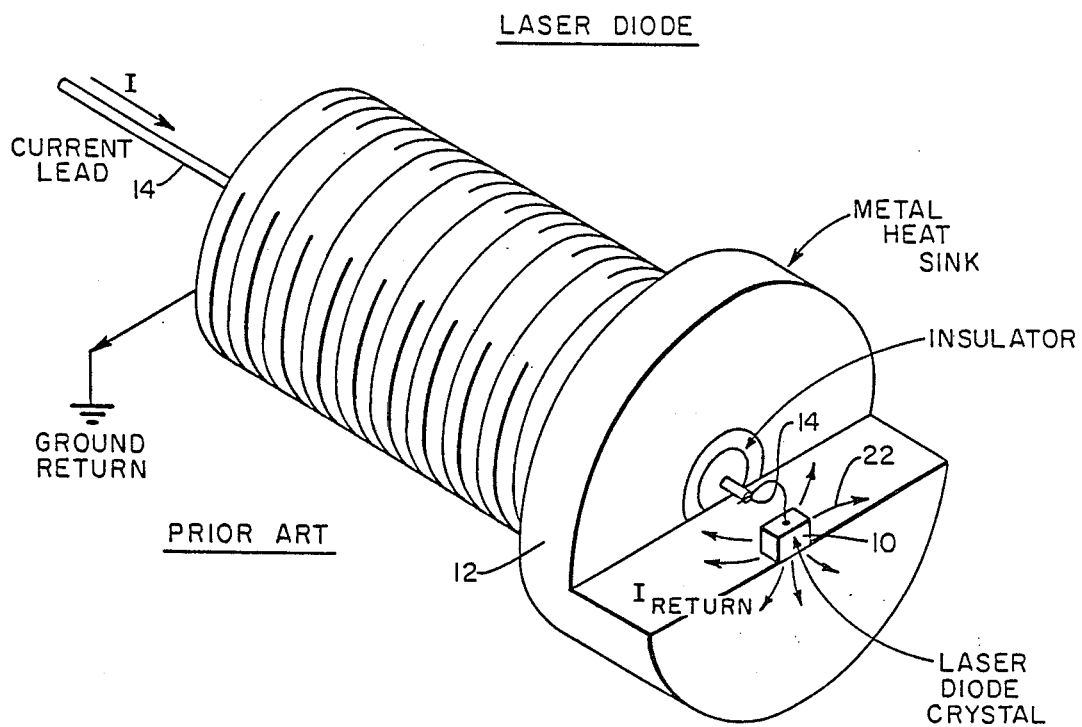

A typical prior art laser diode assembly is shown in FIGS. 1A and 1B which are illustrative of a laser diode configuration in use today. A lasing element 10, activated through electrodes 6 and 8 by pulse, pulsating or noisy inputs, is adapted for mounting on a body 12 of heat conductive material coupled to electrode 8. Excitation lead 14 is connected to electrode 6 at a connection 16. A return lead 18 is connected to the body 12 at a peripheral attachment location 20 remote from the element 10. The element 10 is actuated by applying current to the input lead 14. The current flows through the input lead 14, the element 10, along a separated and distributed return path 22 through the heat conductive body 12 and through the return lead 18.

The flow of pulsed, pulsating or noisy current through the input lead 14, body 12 and the return lead 18 creates a varying electromagnetic field in the vicinity of the leads. Several commercially available laser diode heat sinks (12) and leads (14) and (18) are typically made of steel having magnetostrictive properties. Alternatively, the heat sink body 12 may be mounted to a magnetostrictive structure. The magnetic field will exert magnetic forces on any magnetostrictive sink material, whether the conductive body 12 or support structure and induces elastic or stress waves there. These waves travel through the body 12 and impinge on the element 10 producing undesirable modulation of the optical characteristics of the element 10, causing in turn spectral variations of the emitted laser light.

Element 10 optical characteristics are further modulated by elastic or stress waves thermoelectrically induced in the leads and the body 12 of heat conductive material. The current flow in the body 12 and leads 14 and 18 results in varying thermal expansion and contraction of the current carrying material from current heating. The thermally induced expansion and contraction of the heat sink body material translates into elastic or stress waves within the heat conductive body 12.

These thermally induced elastic waves are conducted through the body 12 to the element 10, acoustically modulating the element 10 and producing undesirable spectral components in the emitted lasing spectra.

In the presence of external magnetic fields, particularly at low frequencies, the current in the leads 14 and 18 and body 12 will cause vibration much like a loud speaker coil. These vibrations are also transmitted to the element 10, creating undesirable modulations in the output radiation.

These noise problems of prior art laser diodes are aggravated when they are closely associated with electric circuits or magnets generating magnetic fields. Such association is commonly required in compact systems of advanced design.

Considerably greater use of laser diodes would be made if these noise problems could be avoided. The noise of laser diodes exhibits a 1/f characteristic, the noise density increasing with lower frequency. The increased ability for magnetic fields to penetrate material at low frequencies correlates with this noise type. In addition, the presence of stress or vibration waves would be likely to shorten element life.

Figure 2A:
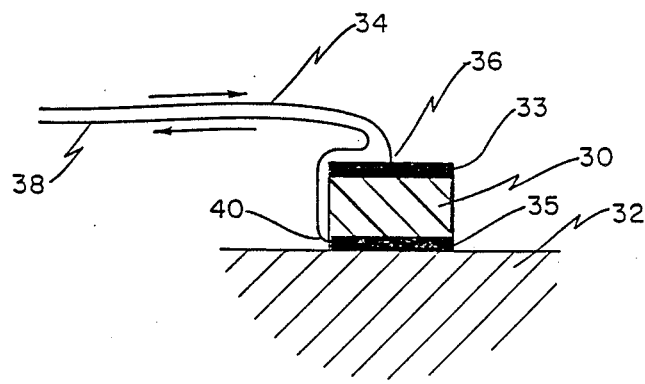
FIGS. 2A and 2B are respectively cross sectional and perspective views in accordance with the present invention illustrating input and return lead dress to be used with laser diode.
Figure 2B:
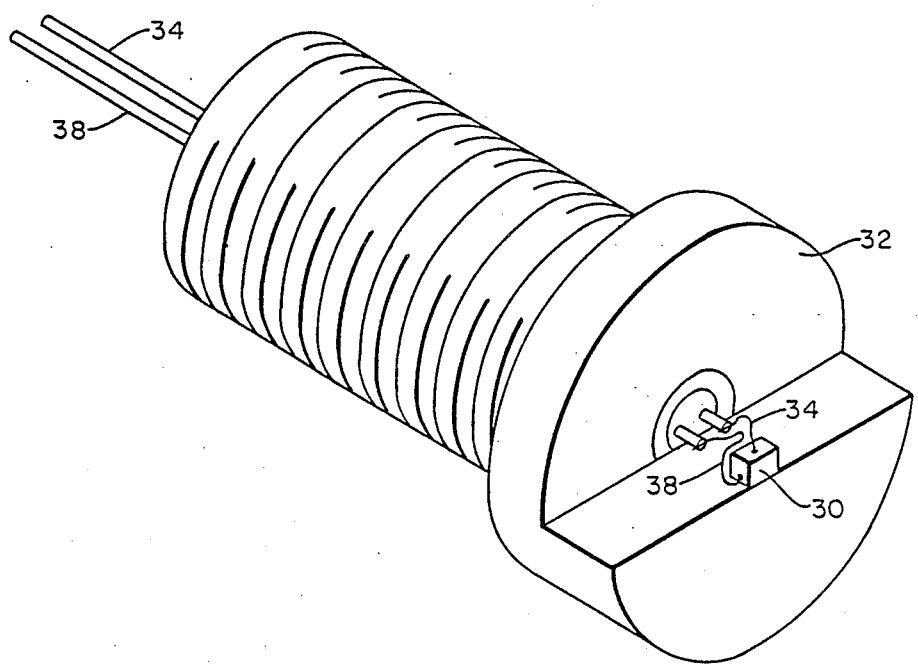

FIGS. 2A and 2B show a laser diode assembly in accordance with the present invention which minimizes disturbance of an active element 30 such as a laser diode crystal due to elastic or stress waves induced through electromagnetic, magnetostrictive and thermoelectric causes. The element 30 is mounted on a heat conductive body 32. An input lead 34 is attached to a top electrode 33 of the element 30 at a point of attachment 36. A return lead 38 is connected to the heat sink body 32 at a connection point 40 of a bottom electrode 35. The electrode 35 may or may not electrically insulate the element 30 from body 32 but is nevertheless thermally conductive. The body 32 may be electrically insulated from support structure.

The flow of varying current through the input lead 34 establishes a pulsed magnetic field circumferentially about the lead 34. The return lead 38 is disposed directly adjacent to input lead 34 such that the varying magnetic field resulting from the flow of current through return lead 38 substantially cancels the magnetic field produced by current flow through input lead 34. Leads 34 and 38 may be a twisted pair or coaxially configured. Cancellation of the magnetic field around the input lead 34 and the return lead 38 reduces the inducement of elastic or stress waves in the heat sink 32 of magnetostrictive material.

It is further found that connection of the return lead 38 to the heat conductive body 32 in close proximity to the element 30 significantly reduces thermoelectrically induced elastic or stress waves by preventing local heating along a current path in the heat sink 32 as discussed in regard to the prior art heat sink. Connection of the return lead 38 at point 40 in close proximity to the element 30 avoids pulsed current flow through the heat conductive body 32, and thereby avoids thermoelectrically induced elastic waves resulting from local heating within the body 32.

The close proximity of the input and output leads 34 and 38 also avoid the generation of vibrations in the wires from the interaction with external magnetic fields.

The leads 34 and 38 as well as body 32 are preferably constructed of nonmagnetostrictive material to further reduce the stress wave generation from stray magnetic fields.

The above described invention is exemplary of a device which overcomes significant disadvantages of prior art laser diodes assemblies. Other modifications, embodiments and departures from the presently disclosed structures are possible without departing from the inventive concepts contained herein. The invention is useful with pulsed or C.W. lasers, fiber optic sensor systems and other applications with or without magnetostrictive elements. Consequently, the invention is to be construed as embracing each and every novel feature and novel combination of features present in, or possessed by the apparatus and technique herein disclosed and are limited solely by the scope and spirit of the appended claims.

What is claimed is:

1. A lasing apparatus for producing output emissions having desired spectral characteristics, comprising:

a heat sink body of heat conductive material having a mounting surface;

an electrically activated lasing element operative to produce the output emissions having the desired spectral characteristics mounted on said mounting surface;

an input excitation current lead electrically coupled to said electrically activated lasing element, said input excitation current lead operative to conduct a pulsed activation current therethrough for activation of said lasing element to produce the output emissions having the desired spectral characteristics, and wherein flow of the pulsed activation current through said input excitation current lead produces a first magnetic field around said input excitation current lead;

a return excitation current lead electrically coupled to said lasing element, said return excitation lead operative to conduct the pulsed activation current away from said lasing element, and wherein flow of the pulsed activation current through said return excitation current lead produces a second magnetic field around said return excitation current lead, and wherein said return excitation current lead is disposed adjacent and in substantially parallel confronting relation to said input excitation current lead in a magnetic field cancellation arrangement wherein the second magnetic field produced by flow of the pulsed activation current through said return excitation current lead substantially cancels the first magnetic field produced by flow of the pulsed activation current through said input excitation current lead;

at least one of said heat sink body, said input excitation current lead and said return excitation current lead is formed from magnetostrictive material; and wherein said lasing apparatus is operative upon activation of said lasing element by flow of the pulsed activation current therethrough to produce the output emissions having the desired spectral characteristics, said magnetic field cancellation arrangement between said input excitation current lead and said return excitation current lead avoiding introduction of stress waves in said lasing apparatus due to magnetostrictive effects and vibrations induced in said input and return excitation current leads by external magnetic fields thereby preventing undesirable altering of the desired spectral characteristics of the output emissions of said lasing apparatus.

2. The lasing apparatus of claim 1 wherein said electrically activated lasing element is a light emitting element operative to produce a predetermined spectral output emission of the desired spectral characteristics and wherein said magnetic field cancellation arrangement comprises a twisted pair arrangement between said input excitation current lead and said return excitation current lead.

3. The lasing apparatus of claim 2 wherein said light emitting element is a semiconductor laser diode.

4. An optical system for producing a pure spectral output emission, comprising:

a heat sink body of a heat conductive material having a mounting surface:

a semiconductor laser diode operative to produce the pure spectral output emission having a desired spectral frequency mounted on said mounting surface:

an input excitation current lead electrically coupled to said semiconductor laser diode, said input excitation current lead operative to conduct a pulsed activation current therethrough for activation of said semiconductor laser diode to produce the pure spectral output emission having the desired spectral frequency, and wherein flow of the pulsed activation current through said input excitation current lead produces a first magnetic field around said input excitation current lead;

a return excitation current lead electrically coupled to said semiconductor laser diode, said return excitation lead operative to conduct the pulsed activation current away from said semiconductor laser diode, and wherein flow of the pulsed activation current through said return excitation current lead produces a second magnetic field around said return excitation current lead, and wherein said return excitation current lead is disposed adjacent and in substantially parallel confronting relation to said input excitation current lead in a magnetic field cancellation arrangement wherein the second magnetic field produced by flow of the pulsed activation current through said return excitation current lead substantially cancels the first magnetic field produced by flow of the pulsed activation current through said input excitation current lead;

at least one of said heat sink body, said input excitation current lead and said return excitation current lead is formed from magnetostrictive material; and wherein said optical system is operative upon activation of said semiconductor laser diode by flow of the pulsed activation current therethrough to produce the pure spectral output emission having the desired spectral frequency, said magnetic field cancellation arrangement between said input excitation current lead and said return excitation current lead avoiding introduction of stress waves in said optical system due to magnetostrictive effects and vibrations induced in said input and return excitation current leads by external magnetic fields thereby preventing undesirable altering of the pure spectral output emission of said semiconductor laser diode.

* * * * *